US010873350B2

(12) United States Patent
Oh et al.

(10) Patent No.: US 10,873,350 B2
(45) Date of Patent: Dec. 22, 2020

(54) DEVICE FOR RECEIVING BROADCAST SIGNAL, DEVICE FOR TRANSMITTING BROADCAST SIGNAL, AND METHOD THEREFOR

(71) Applicant: SAMSUNG ELECTRONICS CO., LTD., Suwon-si (KR)

(72) Inventors: Young Ho Oh, Suwon-si (KR); Hak Ju Lee, Bucheon-si (KR)

(73) Assignee: SAMSUNG ELECTRONICS CO.. LTD., Suwon-si (KR)

( * ) Notice: Subject to any disclaimer, the term of this patent is extended or adjusted under 35 U.S.C. 154(b) by 0 days.

(21) Appl. No.: 16/491,703

(22) PCT Filed: Mar. 6, 2017

(86) PCT No.: PCT/KR2017/002394
§ 371 (c)(1),
(2) Date: Sep. 6, 2019

(87) PCT Pub. No.: WO2018/164289
PCT Pub. Date: Sep. 13, 2018

(65) Prior Publication Data
US 2020/0076454 A1    Mar. 5, 2020

(51) Int. Cl.
*H04B 1/00*      (2006.01)
*H04N 19/65*     (2014.01)
(Continued)

(52) U.S. Cl.
CPC ......... *H04B 1/0067* (2013.01); *H04L 1/0057* (2013.01); *H04L 25/022* (2013.01); *H04N 19/65* (2014.11); *H04N 21/426* (2013.01)

(58) Field of Classification Search
None
See application file for complete search history.

(56) References Cited

U.S. PATENT DOCUMENTS

| 6,911,950 B2 | 6/2005 | Harron |
| 7,202,914 B2 | 4/2007 | Wu et al. |

(Continued)

FOREIGN PATENT DOCUMENTS

| KR | 10-2010-0066371 A | 6/2010 |
| KR | 10-2013-0061257 A | 6/2013 |

(Continued)

OTHER PUBLICATIONS

International Search Report dated Dec. 5, 2017, issued by the International Searching Authority in International Application No. PCT/KR2017/002394 (PCT/ISA/210).

(Continued)

*Primary Examiner* — Chikaodili E Anyikire
(74) *Attorney, Agent, or Firm* — Sughrue Mion, PLLC

(57) ABSTRACT

A reception device is disclosed. The reception device comprises: a reception unit for receiving a signal including at least one of a channel estimation signal, a transmitter identification (TxID) signal, and a preamble signal; a TxID detection unit for detecting the TxID signal from the received signal; a TxID processing unit for changing the frequency band of the detected TxID signal, on the basis of a result of the detection of the TxID signal; and an attenuation unit for attenuating the TxID signal in the received signal by using the TxID signal having the changed frequency band.

16 Claims, 21 Drawing Sheets

(51) Int. Cl.
*H04L 1/00* (2006.01)
*H04L 25/02* (2006.01)
*H04N 21/426* (2011.01)

(56) References Cited

U.S. PATENT DOCUMENTS

| | | | |
|---|---|---|---|
| 7,307,666 B2 | 12/2007 | Wu et al. | |
| 8,582,689 B2 | 11/2013 | Park et al. | |
| 8,787,821 B2* | 7/2014 | Lim | H04N 21/6112 |
| | | | 348/729 |
| 8,837,553 B2 | 9/2014 | Park et al. | |
| 9,674,019 B2* | 6/2017 | Baek | H04L 27/2628 |
| 9,742,530 B2 | 8/2017 | Atungsiri et al. | |
| 9,954,704 B2* | 4/2018 | Atungsiri | H04B 17/336 |
| 2004/0170224 A1* | 9/2004 | Ogino | H04N 7/06 |
| | | | 375/242 |
| 2005/0117070 A1 | 6/2005 | Wu et al. | |
| 2010/0142481 A1* | 6/2010 | Lim | H04W 72/005 |
| | | | 370/331 |
| 2011/0103515 A1 | 5/2011 | Park et al. | |
| 2013/0142219 A1 | 6/2013 | Park et al. | |
| 2017/0026152 A1 | 1/2017 | Atungsiri et al. | |
| 2017/0026219 A1 | 1/2017 | Atungsiri | |
| 2017/0195153 A1* | 7/2017 | Kwak | H04L 27/2608 |
| 2019/0280763 A1* | 9/2019 | Smyth | H04B 7/18517 |

FOREIGN PATENT DOCUMENTS

| | | |
|---|---|---|
| KR | 10-2012-0115058 A | 10/2014 |
| KR | 1020150068036 A | 6/2015 |
| KR | 1020160058937 A | 5/2016 |
| WO | 2016/140445 A1 | 9/2016 |

OTHER PUBLICATIONS

Written Opinion dated Dec. 5, 2017, issued by the International Searching Authority in International Application No. PCT/KR2017/002394 (PCT/ISA/237).

Communication dated Aug. 24, 2020 issued by the Korean Intellectual Property Office in Korean Application No. 10-2019-7018055.

* cited by examiner

US 10,873,350 B2

DEVICE FOR RECEIVING BROADCAST SIGNAL, DEVICE FOR TRANSMITTING BROADCAST SIGNAL, AND METHOD THEREFOR

TECHNICAL FIELD

Embodiments disclosed herein relate to a receiving apparatus for receiving a broadcast signal, a transmitting apparatus for transmitting a broadcast signal, and a method for transmitting and receiving a broadcast signal.

BACKGROUND ART

Digital broadcasting technology is a broadcasting technique capable of transmitting a large amount of data. In Europe, a broadcasting system based on digital video broadcast-terrestrial version 2 (DVB-T2) has been adopted, and in the advanced television system committee (ATSC) in the United States, ATSC 3.0 is being standardized.

ATSC 3.0 includes technologies for providing an enhanced system transmission capacity and robust signal reception. ATSC 3.0 considers efficient spectrum use, reception robustness and flexible service provision as important factors. ATSC 3.0 can provide a high SNR in a wider area.

ATSC 3.0 includes all standards for the management and protocol layers, application and service presentation layer as well as the physical layer. A technology for transmitting a TxID (transmitter identification) in the ATSC 3.0 physical layer specification has been established. A receiver is able to use the TxID for location-based services and location-based base station identification.

DISCLOSURE

Technical Problem

A conventional transmitting apparatus may selectively transmit a TxID at a preamble symbol position in an existing frame. The TxID may appear as noise in the receiving apparatus. According to the conventional transmitting apparatus or receiving apparatus, performance degradation of from at least 0.02 dB to 2 dB may occur depending on the L1 FEC (forward error coding) and the injection level. Therefore, when the TxID is transmitted, a method for overcoming performance degradation in a receiver is required.

Various embodiments disclosed herein propose a receiving apparatus, a transmitting apparatus, and a transmitting or receiving method for solving the above-mentioned problems and improving decoding performance.

Technical Solution

According to an embodiment disclosed herein, a receiving apparatus includes a reception unit that receives a signal including at least one of a channel estimation signal, a transmitter identification (TxID) signal or a preamble signal, a TxID detection unit that detects the TxID signal in the received signal, a TxID processing unit that changes a frequency band of the TxID signal based on a result of detection of the TxID signal, and a reduction unit that reduces the TxID signal from the received signal using the TxID signal having the changed band.

According to another embodiment disclosed herein, a receiving method includes receiving a signal including at least one of a channel estimation signal, a transmitter identification (TxID) signal or a preamble signal, detecting the TxID signal in the received signal, changing a frequency band of the TxID signal based on a result of detection of the TxID signal, and reducing the TxID signal from the received signal using the TxID signal having the changed band.

Further, a transmitting apparatus according to another embodiment disclosed herein may include a control unit that determine whether to transmit a transmitter identification (TxID) and allows a signal processing unit to generate an additional parity bit when there is TxID transmission, the signal processing unit that generates L1 (layer 1) signaling and an additional parity bit for the L1 signaling, and a transmission unit that transmits the additional parity bit through a first frame and transmits the L1 signaling through a second frame following the first frame.

Advantageous Effects

According to the embodiments disclosed in the disclosure, the receiving apparatus may efficiently decode the received signal.

According to the embodiments disclosed in the disclosure, the transmitting apparatus may efficiently transmit a signal to enhance the decoding performance of the receiving apparatus.

In addition, various effects may be provided that are directly or indirectly understood through the disclosure.

MODE FOR INVENTION

Figure 1:
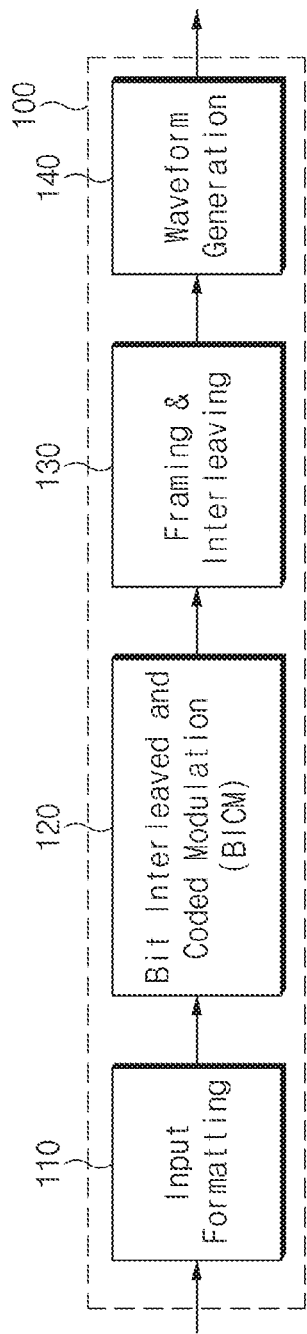
FIG. 1 is a block diagram illustrating a configuration of a transmitting apparatus according to an embodiment.

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure. With regard to description of drawings, similar components may be marked by similar reference numerals.

In the disclosure, the expressions "have", "may have", "include" and "comprise", or "may include" and "may comprise" used herein indicate existence of corresponding features (e.g., components such as numeric values, functions, operations, or parts) but do not exclude presence of additional features.

In the disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in the disclosure may be used to refer to various components regardless of the order and/or the priority and to distinguish the relevant components from other components, but do not limit the components. For example, "a first user device" and "a second user device" indicate different user devices regardless of the order or priority. For example, without departing the scope of the disclosure, a first component may be referred to as a second component, and similarly, a second component may be referred to as a first component.

It will be understood that when an component (e.g., a first component) is referred to as being "(operatively or communicatively) coupled with/to" or "connected to" another component (e.g., a second component), it may be directly coupled with/to or connected to the other component or an intervening component (e.g., a third component) may be present. In contrast, when an component (e.g., a first component) is referred to as being "directly coupled with/to" or "directly connected to" another component (e.g., a second component), it should be understood that there are no intervening component (e.g., a third component).

According to the situation, the expression "configured to" used in the disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other parts. For example, a "processing unit configured to (or set to) perform A, B, and C" may mean a dedicated processing unit (e.g., an embedded processing unit) for performing a corresponding operation or a generic-purpose processing unit (e.g., a central processing unit (CPU) or an application processing unit) which performs corresponding operations by executing one or more software programs which are stored in a memory device.

Terms used in the disclosure are used to describe specified embodiments and are not intended to limit the scope of the disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of the disclosure. In some cases, even if terms are terms which are defined in the disclosure, they may not be interpreted to exclude embodiments of the disclosure.

Hereinafter, an apparatus and a method proposed in an embodiment disclosed herein may be applied to a digital multimedia broadcasting (DMB) service, a digital video broadcasting handheld (DVB-H), and a mobile broadcasting service such as an advanced television systems committee mobile/handheld (ATSC-M/H) service, a digital broadcasting system such as an internet protocol television (IPTV) service, a moving picture experts group (MPEG) media transport (MMT) system and an evolved packet system (EPS), a long term evolution (LTE) mobile communication system, an advanced-LTE (LTE-A) mobile communication system, a high speed downlink packet access (HSDPA) mobile communication system, a high speed uplink packet access (HSUPA) mobile communication system, 3rd generation project partnership 2 (3GPP2), high rate packet data (HRPD) mobile communication system, 3GPP2 wideband code division multiple access (WCDMA) mobile communication system, 3GPP2 code division multiple access (CDMA) mobile communication, a communication system such as IEEE (Institute of Electrical and Electronics Engineers) 802.16m, mobile internet protocol (mobile IP) system and the like. Hereinafter, embodiments disclosed in the disclosure will be described on the basis of the ATSC system. Operations of a transmitting or receiving apparatus which are not described in the disclosure may refer to related standard documents such as "ATSC standard, physical layer protocol (A/322)".

The ATSC physical layer protocol provides flexibility to select various operating modes. According to an embodiment disclosed in the disclosure, a transmitting apparatus may process a broadcast signal for a next-generation broadcasting service according to a non-multiple input multiple output (MIMO) transmission mode or a MIMO transmission mode. According to an embodiment, the non-MIMO scheme may include a multiple input single output (MISO) transmission mode and a single input single output (SISO) transmission mode.

A physical layer pipe (PLP) may be a data stream encoded with a specific modulation, code rate and length. One input stream may be transferred via one PLP. Each PLP may refer to an independent signal path for transferring one data stream. Hereinafter, the PLP may be referred to as a data stream. A physical layer pipe (PLP) may be a data stream encoded with a specific modulation, code rate and length.

The PLP may be a basic unit for robustness control. The PLP may affect a quality of service (QoS). Independent blocks for each PLP (e.g., an input formatting block and a BICM block) may be used. One or multiple service(s) may be transferred by a single PLP. The PLP may be a single PLP or multiple PLPs. FIG. 1 is a block diagram illustrating a configuration of a transmitting apparatus (or a transmitting system) according to an embodiment.

Referring to FIG. 1, a transmitting apparatus 100 may include an input formatting block 110, a bit interleaved and coded modulation (BICM) block 120, a framing and interleaving block 130, and a waveform generation block 140.

The input formatting block 110 may generate a baseband (BB) packet from an input stream for data to be served. The input stream may be a transport stream (TS), Internet packets (IP), MPEG media transport (MMT), a generic stream (GS), generic stream encapsulation (GSE), or the like. For example, the input formatting block 110 may generate ALP (ATSC 3.0 link protocol) packets based on an input stream including an IP and generate BB packets based on the generated packets.

The BICM block 120 may perform forward error coding (FEC) encoding according to a region in which data is to be transmitted, interleave an encoded bit stream, and map the same to a complex-valued constellation symbol.

The framing and interleaving block 130 may combine the time interleaved data in the BICM block 120 with a signaling signal to generate a transmission frame.

The waveform generation block 140 may generate an OFDM signal in the time domain for the generated transmission frame, and modulate the generated OFDM signal into a radio frequency (RF) signal. The RF signal may be transmitted to the transmitter. The RF signal may be transmitted to the receiving device.

Figure 2:
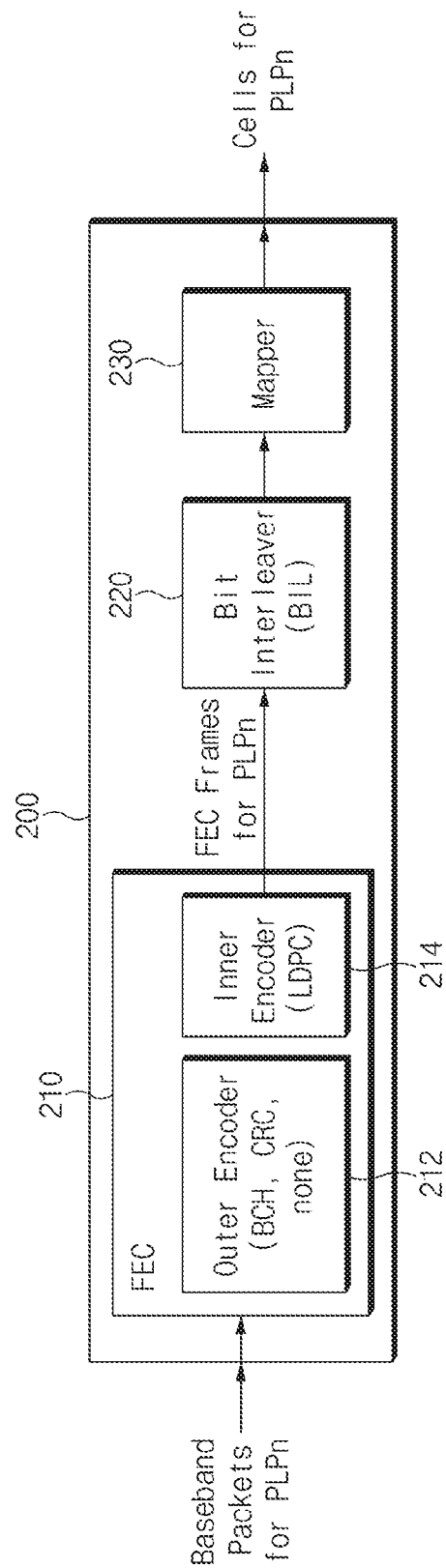
FIG. 2 is a block diagram illustrating a configuration of a BICM block according to an embodiment.

FIG. 2 illustrates a configuration of a BICM block according to an embodiment.

Referring to FIG. 2, a BICM block 200 may include three parts such as an FEC block 210, a bit interleaver 220, and a mapper 230. The BICM block 200 may perform an independent operation for each PLP. The BICM block 200 may output a cell by inputting a BB packet.

The FEC block 210 may perform encoding on the BB packet and output a corresponding FEC frame. The FEC frame may include a BB packet payload, an outer code parity, and/or an inner code parity.

The FEC block 210 may include an outer encoder 212 that performs encoding using an outer code and an inner encoder 214 that performs encoding using an inner code. In one embodiment, the outer code may be selectively applied among bose-chaudhuri-hocquenghem (BCH) and cyclic redundancy check (CRC). The outer code may not be used (none). The inner code may be a low density parity check (LDPC) code. The inner code may be used to provide redundancy for reception correction of the transmitted BB packet. The inner encoder 214 may be referred to as an LDPC encoder.

The LDPC encoder 214 may perform LDPC encoding to generate an LDPC codeword. The LDPC code may be a code for generating a parity bit added to a payload of each BB packet. The LDPC encoder 214 may perform LDPC encoding on LDPC information bits to generate an LDPC parity bit and generate an LDPC codeword. The LDPC codeword may include an LDPC information bit and an LDPC parity bit. For inner encoding, a cyclic LDPC code may be used. Two types of coding schemes, Type A and Type B may be used for inner encoding. A predefined code rate and code length for each type may be used. The length of the inner code (Ninnner) may be either 54800 bits or 16200 bits.

The bit interleaver 220 may interleave the FEC frame and output the interleaved FEC frame.

The mapper 230 may map FEC encoded and interleaved bits to constellations. The mapper 230 may output a cell with the interleaved FEC frame bits as an input.

Figure 3:
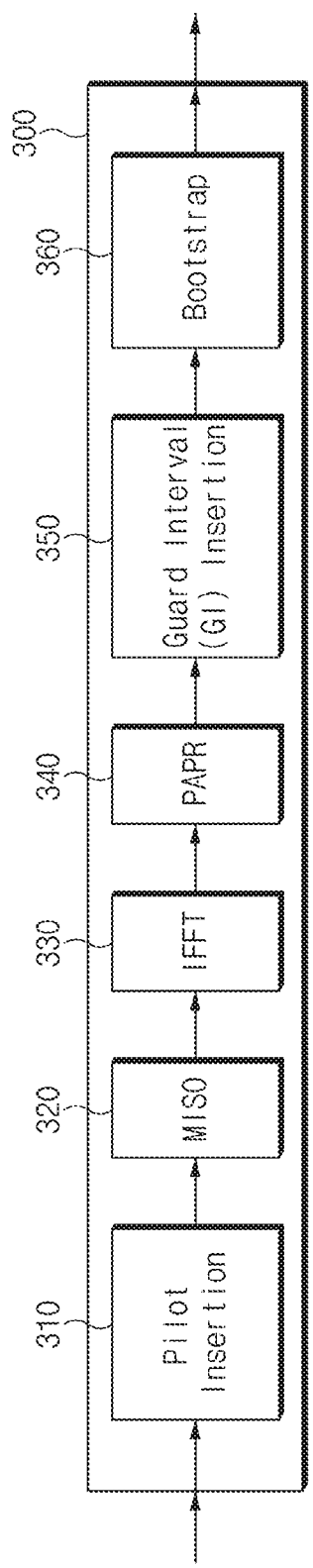
FIG. 3 is a block diagram illustrating a configuration of a waveform generation block according to an embodiment.

FIG. 3 is a block diagram illustrating a configuration of a waveform generation block according to an embodiment.

A waveform generation block 300 may include a pilot insertion block 310, an MISO block 320, an Inverse Fast Fourier Transform (IFFT) block 330, a Peak to Average Power Ratio (PAPR) block 340, a guard interval (GI) insertion block 350, and a bootstrap block 350.

Various cells in an OFDM frame may be modulated with reference information which the receiving apparatus knows in advance. The cells may contain reference information that may be transmitted at a boosted power level. Such cells may be referred to as a preamble pilot, a scattered pilot, a continual pilot, an edge pilot, and a subframe boundary pilot in a generated frame.

The pilot insertion block 310 may insert a preamble pilot, a scattered pilot, a continual pilot, an edge pilot, and a subframe boundary pilot into the generated frame. The pilot may be inserted into a predefined position. The pilot may be inserted with a predefined amplitude. In one embodiment, the position and amplitude of the pilot may refer to sections 8.1.3 to 8.1.7 of the standard document 'ATSC standard, physical layer protocol (A/322)'.

The MISO block 320 may perform MISO pre-distortion by applying a transmit diversity code filter to the frame.

The IFFT block 330 may perform IFFT on the frame such that each OFDM symbol is divided into a useful part and a guard interval.

The PAPR block 340 may perform OFDM signal modification, tone reservation, and active constellation to reduce the PAPR of an output OFDM symbol.

The GI insertion block 350 may insert a guard interval into the frame. The pattern of an insertable guard interval may be a pattern that is predefined according to the FFT size of the OFDM symbol.

The bootstrap 360 may insert a generated bootstrap into the frame. A method of inserting bootstrap may refer to the standard document 'ATSC, A/321, system discovery and signaling'.

Figure 4:
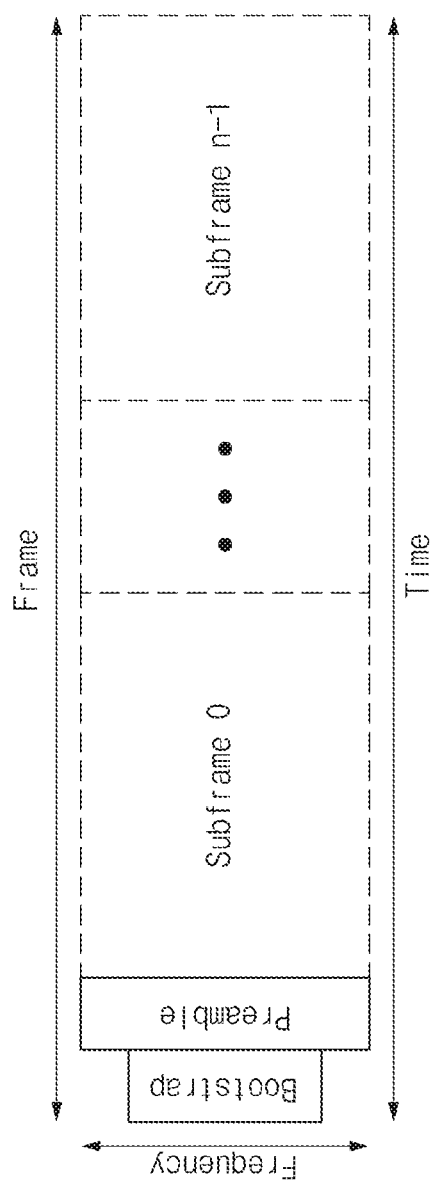
FIG. 4 illustrates a frame structure according to an embodiment.

FIG. 4 illustrates a frame structure according to an embodiment.

Referring to FIG. 4, a frame may include a bootstrap located at the beginning of the frame, a preamble following the bootstrap, and a payload including at least one subframe.

The bootstrap may be located at the beginning of the frame and may contain several symbols. A first symbol may be used for synchronization. The remaining symbols may transfer signaling information such as a sampling frequency, an FFT size, a guard interval size, and a pilot pattern. The bootstrap may use a constant bandwidth (e.g., 4.5 MHz) regardless of the bandwidth of a channel.

The preamble may contain L1 control signaling used to process data contained in the payload. The preamble may contain a plurality of preamble symbols for transmitting L1 signaling data. The preamble symbol may transmit L1-Basic data and/or L1-Detail data. The L1-Basic data and the L1-Detail data may be input to a framing and interleaving block (e.g., 130) for insertion into the preamble. The symbols that do not carry L1-Basic data and L1-Detail data among the preamble symbols may carry PLP data. The FFT size, guard interval (GI), and scattered pilot pattern of the preamble may be signaled by the bootstrap.

The payload may contain at least one subframe. When a plurality of subframes exist in the payload, the plurality of subframes may be continuously positioned with respect to the time axis. Each subframe may contain an FFT size, a GI length, a scattered pilot pattern, and a number of transmission carriers (NoC). The FFT size, GI length, scattered pilot pattern, and number of transmission carriers may not be changed within the same subframe. The FFT size, the GI length, the scattered pilot pattern, and the number of transmission carriers may differ between different subframes within a frame.

The L1 signaling may provide necessary information to configure physical layer parameters. L1 according to an embodiment may refer to layer-1, which is the lowest layer of the ISO 7 hierarchical model.

The L1 signaling may include bootstrap, L1-Basic, L1-Detail signaling. The L1-Basic and L1-Detail signaling may be transmitted by the preamble symbol.

The L1-Basic signaling may define parameters needed to decode L1-Detail signaling and convey basic system information. The L1-Detail signaling may define data context and required details to decode the data context or the like. The L1-Detail signaling may vary from frame to frame.

Separate encoding techniques may be applied to protect L1-Basic and L1-Detail data.

Figure 5:
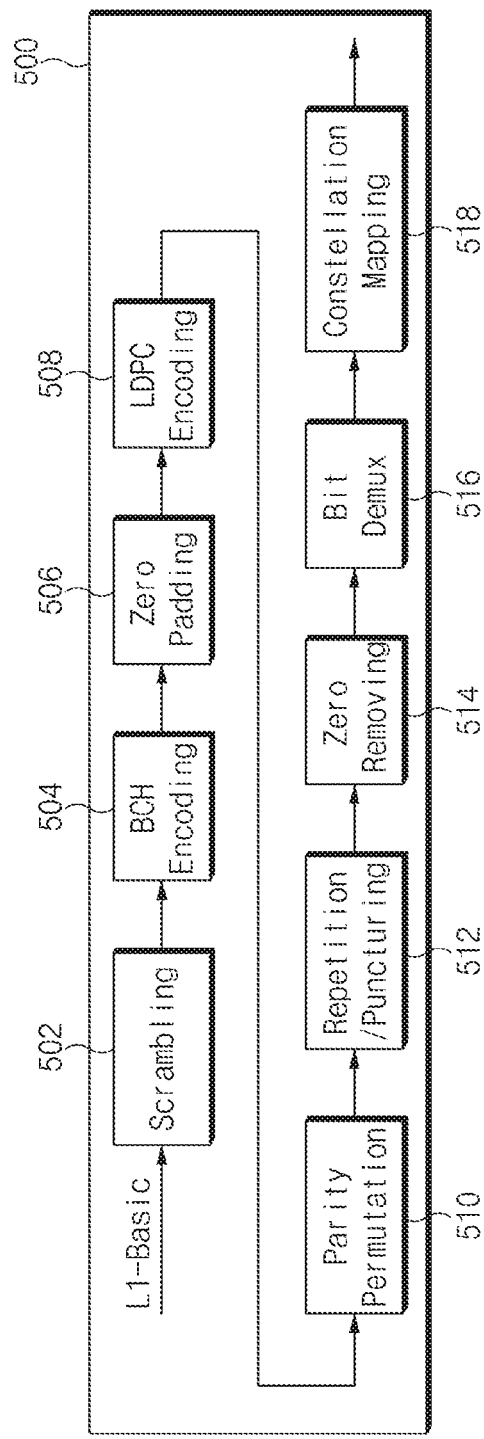
FIG. 5 is a block diagram illustrating a configuration of an L1-Basic protection block according to an embodiment.

FIG. 5 is a block diagram illustrating a configuration of an L1-Basic protection block according to an embodiment. An L1-Basic protection block 500 may generate L1-Basic signaling.

The L1-Basic information may be scrambled in a scrambling block 502 and BCH encoded in a BCH encoding block 504. A zero padding block 506 may insert a zero padding bit. The output bits of the zero padding block 506 may be LDPC encoded by an LDPC encoding block 508 and may be permutated by a parity permutation block 510. A repetition/puncturing block 512 may generate additional repeated bits for selected bits of bits in the LDPC codeword and perform puncturing on some LDPC parity bits after the parity permutation. A zero removing block 514 may remove the zero padding bits. The zero padding bits may not be transmitted. A bit demux block 516 may demultiplex a block interleaved group bit-by-bit and a constellation mapping block 518 may map the bits, which are demultiplexed by the bit demux block 516 after removing the zero padding bits, onto constellation symbols.

Figure 6:
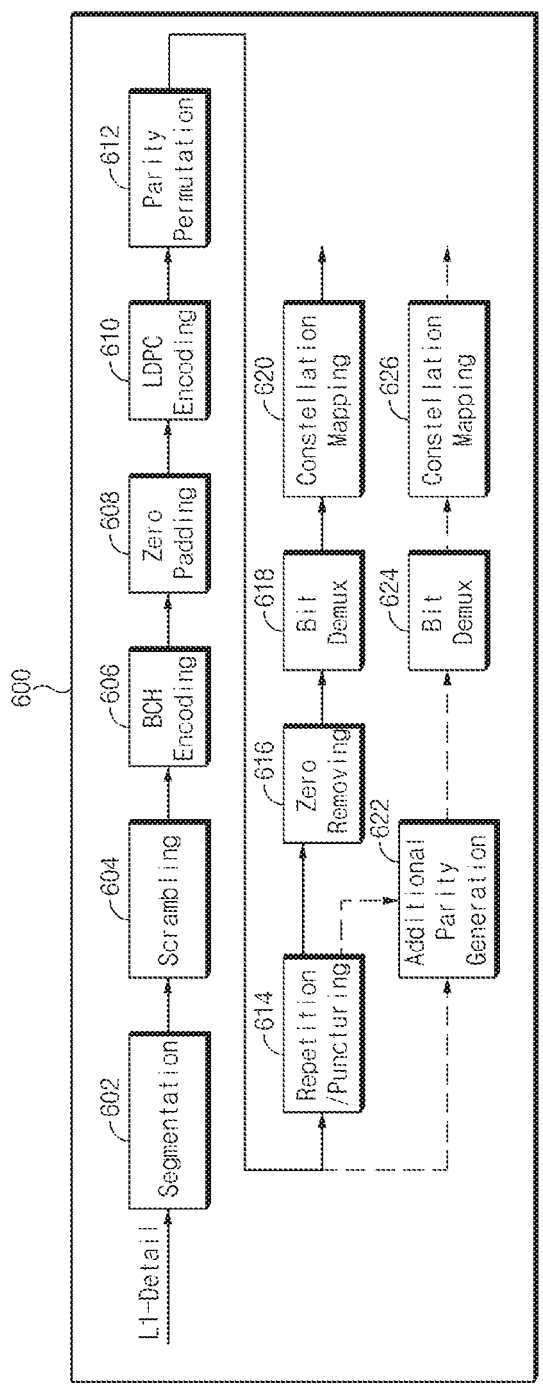
FIG. 6 illustrates a L1-Detail specific block for processing L1-Detail information according to an embodiment.

FIG. 6 illustrates an L1-Detail specific block for processing L1-Detail information.

An L1-Detail specific block 600 may generate L1-Detail signaling. Referring to FIG. 6, some components of the L1-Detail specific block 600 such as a scrambling block 604, a BCH encoding block 606, a zero padding block 608, an LDPC encoding block 61, a parity permutation block 612, a repetition/puncturing block 614, a zero removing block 616, bit Demux blocks 618 and 624 and constellation mapping blocks 620 and 626 are the same as those of the L1-Basic protection block and therefore, a duplicated description is omitted below.

The L1-Detail specific block 600 may further include a segmentation block 602 for processing of the L1-Detail signaling.

The amount of the L1-Detail signaling bits is variable, so that when the number of L1 Detail signaling bits is greater than a predetermined threshold value, the L1 Detail signaling may be segmented to have a value below the predetermined threshold value. A related standard document such as "ATSC standard, physical layer protocol (A/322)" defines the predetermined threshold and Ksig, in relation to a signaling type, a constellation mapping method, a L1-Detail signaling mode, and the like.

The segmentation block 602 may divide the L1-Detail signaling into a plurality of coded blocks each having the same number of bits. The segmentation block 602 may calculate Ksig and segment the whole L1-Detail signaling by the number of Ksig bits. The L1 signaling bits of size Ksig may correspond to one coded block.

The segmentation block 602 may calculate the number of L1-Detail information bits contained in each coded block, and calculate L1 Padding bits. The segmentation block 602 may fill a padding part of the coded block with zero bits.

In some cases, the L1-Detail specific block 600 may include an additional parity generation block 622 and the bit demux block 624 and the constellation mapping block 626 for processing a block with appended additional parity.

The additional parity generation block 622 may generate additional parity for the L1-Detail signaling. The details of the additional parity generation will be described later.

Figure 7:
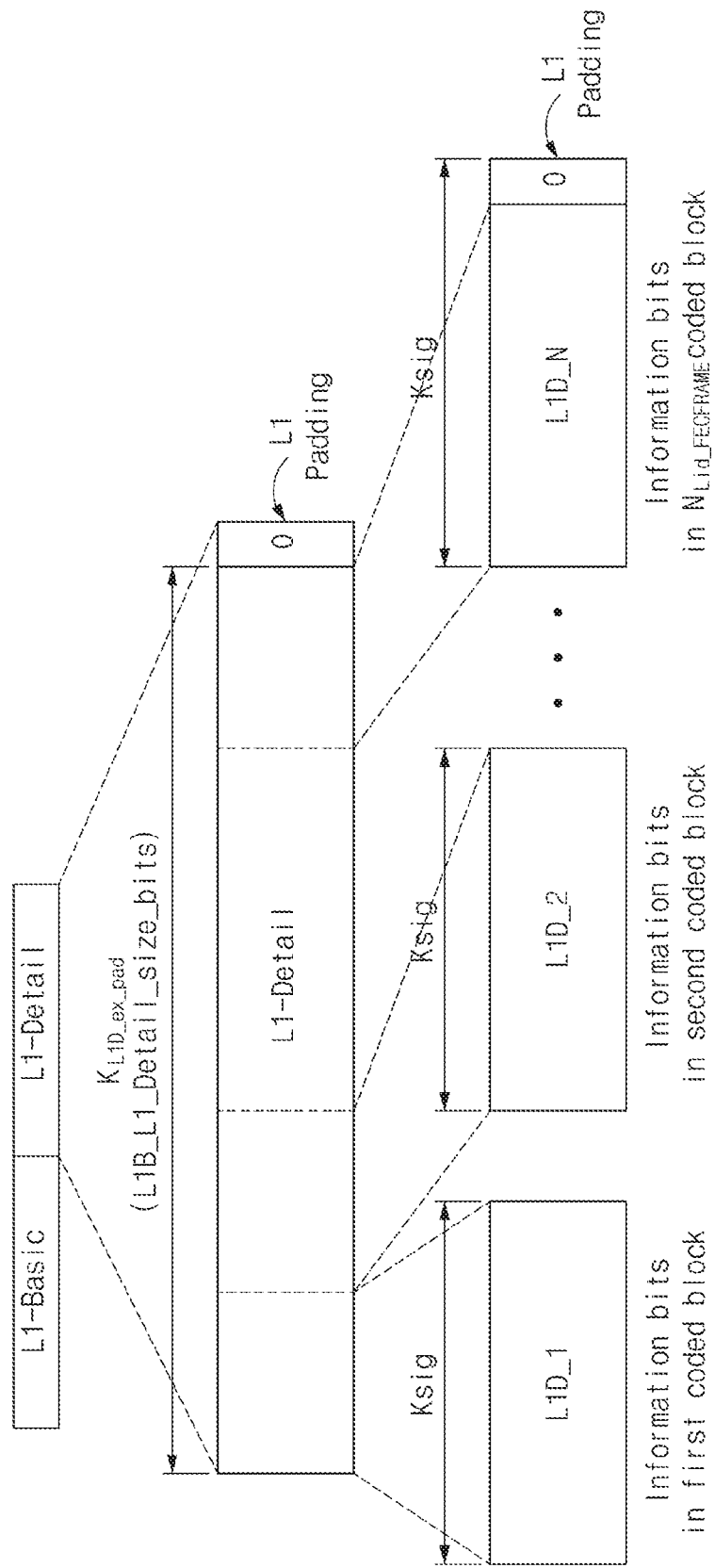
FIG. 7 is a diagram for describing segmentation of L1-Detail signaling.

FIG. 7 is a diagram for describing the segmentation of the L1-Detail signaling.

A preamble may contain L1-Basic signaling and L1-Detail signaling. The L1-Detail signaling may contain L1-padding bits having L1-Detail information bits and a zero value.

Referring to FIG. 7, when the L1-Detail information bits are segmented into N (N>1) L1-Detail blocks, each L1-Detail block is scrambled and concatenated with a BCH outer code and an LDPC inner code to be protected.

For robustness of the L1-Detail signaling, additional parity bits may be generated by an additional parity generation block (e.g., 622). When additional parity is used, a diversity gain of L1 signaling may be obtained.

Figure 8:
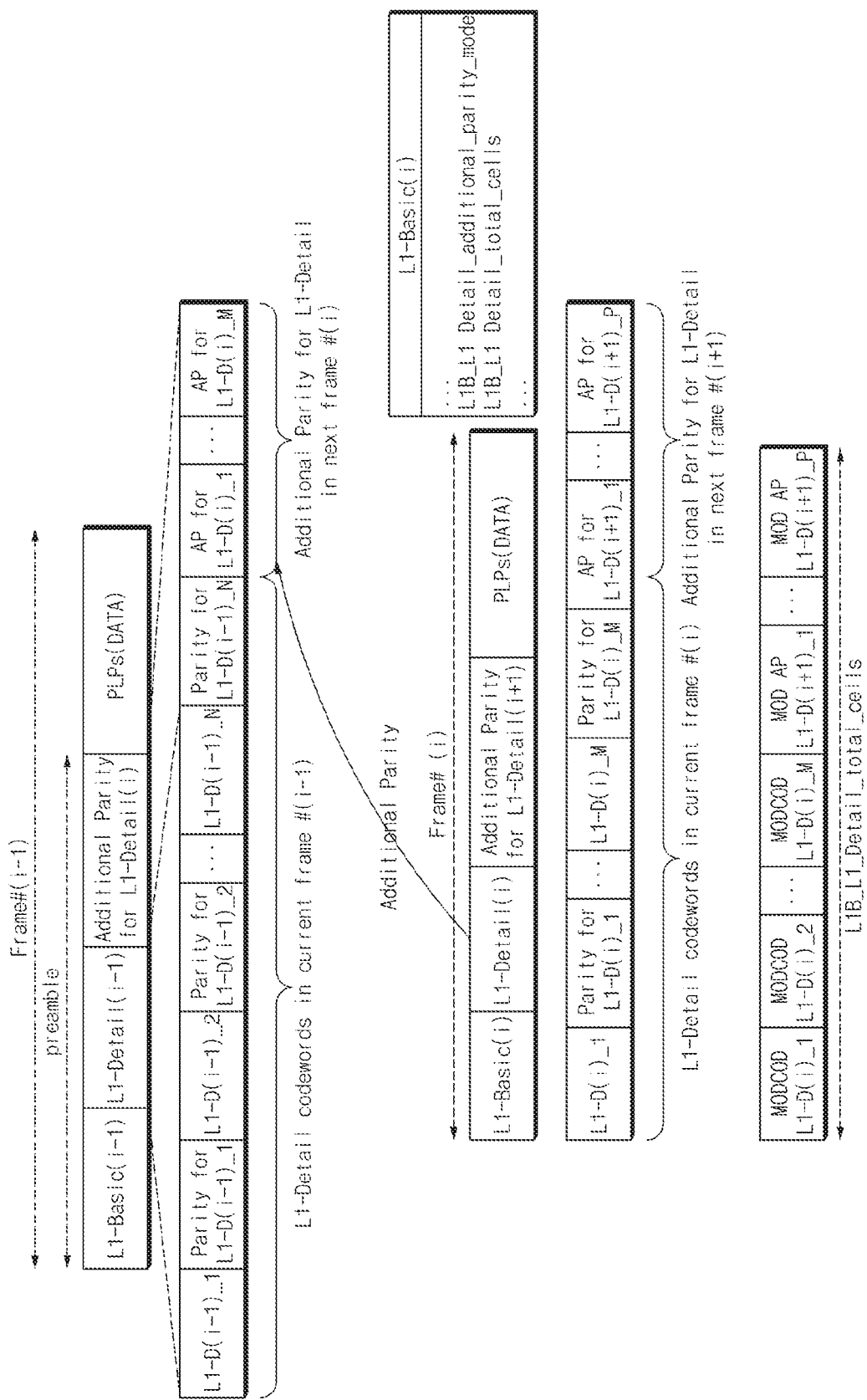
FIG. 8 illustrates a frame structure when additional parity bits are generated.

FIG. 8 illustrates a frame structure when additional parity bits are generated.

Referring to FIG. 8, a frame #(i) may be an i-th frame and frame #(i−1) may be a previous frame of the i-th frame. The frame #(i) may be referred to as a first frame, and the frame #(i−1) may be referred to as a second frame. Additional parity bits for the L1-Detail signaling of the i-th frame may be transmitted in the (i−1)-th frame which is the closest (in time) previous frame. In this case, the i-th frame and the (i−1)-th frame may have the same bootstrap major/minor version. The additional parity bits for the L1-Detail signaling of the i-th frame may be transmitted in the preamble of the (i−1)-th frame.

The use of the additional parity for the L1-Detail signaling of the i-th frame may be signaled in the (i−1)-th frame. L1B_L1_Detail_additional_parity_mode field in the (i−1)-th frame may be transmitted through L1-Basic signaling. When the L1B_L1_Detail_additional_parity_mode is set to 00, the additional parity for the i-th frame may not be transmitted in the (i−1) th frame.

The additional parity generation block may select at least some bits of the LDPC parity bits generated based on the L1-Detail signaling transmitted in the i-th frame to generate additional parity bits. In one embodiment, some bits in the LDPC parity bits generated in such a way that the L1-Detail signaling is LDPC encoded may be punctured and not transmitted to the receiving apparatus. In this case, the additional parity generation block may generate additional parity bits by selecting some or all of the punctured LDPC parity bits among the LDPC parity bits generated in such a way that the L1-Detail signaling transmitted in the i-th frame is LDPC encoded. The number of additional parity bits may be decided from the total number of transmitted bits in the current frame.

The additional parity bits may be interleaved and mapped onto constellations. The constellations for the additional parity bits may be generated in the same manner as for the repeated, punctured and zero-removed L1-Detail signaling bits that are transmitted in the current frame. After mapping onto the constellations, the additional parity bits may be appended to the L1-Detail specific block (e.g., 600) in the frame preceding the current frame carrying the L1-Detail signaling of the current frame. The additional parity bits may be located after the L1-Detail signaling in time in the preamble.

Figure 9:
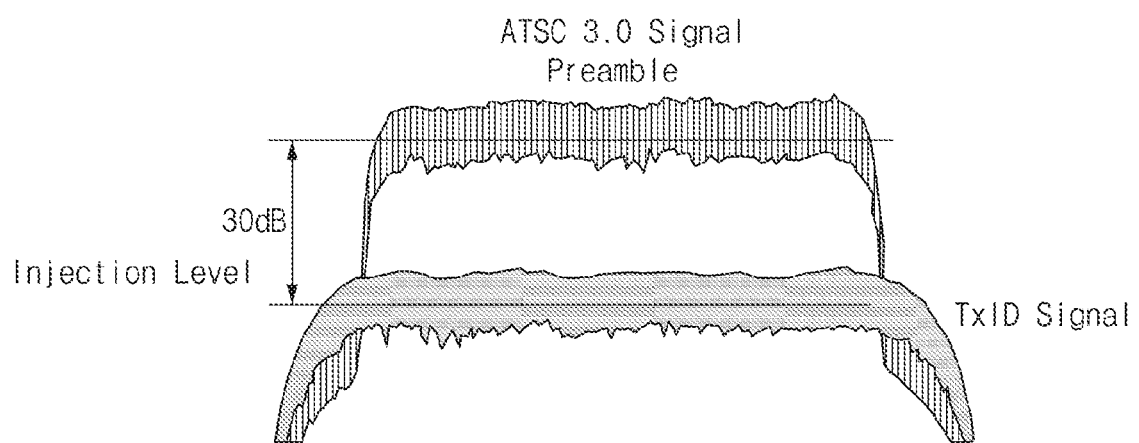
FIG. 9 illustrates waveforms of an ATSC 3.0 signal and a TxID signal transmitted according to an embodiment.

FIG. 9 illustrates waveforms of an ATSC 3.0 signal and a TxID signal transmitted according to an embodiment.

A transmitter identification (TxID) may allow a receiving apparatus to identify each individual transmitter. A TxID signal may be injected into a host ATSC3.0 signal in the time domain and transmitted simultaneously with the host ATSC3.0 signal.

A wide range of injection levels for injecting the TxID signal into the host ATSC 3.0 preamble may be available. Reception performance degradation may be caused according to an L1 FEC mode and an injection level.

Table 1 shows the reception performance according to the injection level and the L1 FEC mode.

TABLE 1

| | Preamble performance[dB] | | | | | | | | | | | |
|---|---|---|---|---|---|---|---|---|---|---|---|---|
| | Mode 1 | | Mode 2 | | Mode 3 | | Mode 4 | | Mode 5 | | Mode 6 | |
| Injection level | L1-Basic | L1-Detail | L1-Basic | L1-Detail | L1-Basic | L1-Detail | L1-Basic | L1-Detail | L1-Basic | L1-Detail | L1-Basic | L1-Detail |
| Off | −9.2 | −7.8 | −2.7 | −1.2 | 0.9 | 2 | 5.4 | 6.5 | 9.7 | 11 | 14.9 | 16.5 |
| −15 dB | −9.18 | −7.78 | −2.63 | −1.09 | 1.07 | 2.22 | 5.90 | 7.16 | 11.22 | 13.20 | 31.33 | N/A |
| −18 dB | −9.19 | −7.79 | −2.66 | −1.15 | 0.99 | 2.11 | 5.65 | 6.82 | 10.40 | 11.97 | 17.82 | 21.85 |
| −21 dB | −9.2 | −7.79 | −2.68 | −1.17 | 0.94 | 2.06 | 5.52 | 6.66 | 10.03 | 11.46 | 16.12 | 18.40 |

Referring to Table 1, when the TxID is injected, the reception performance in each mode is worse compared to a case where the TxID is off. The higher the injection level, the worse the reception performance. That is, the TxID signal may appear as noise in the ATSC 3.0 waveform.

Figure 10:
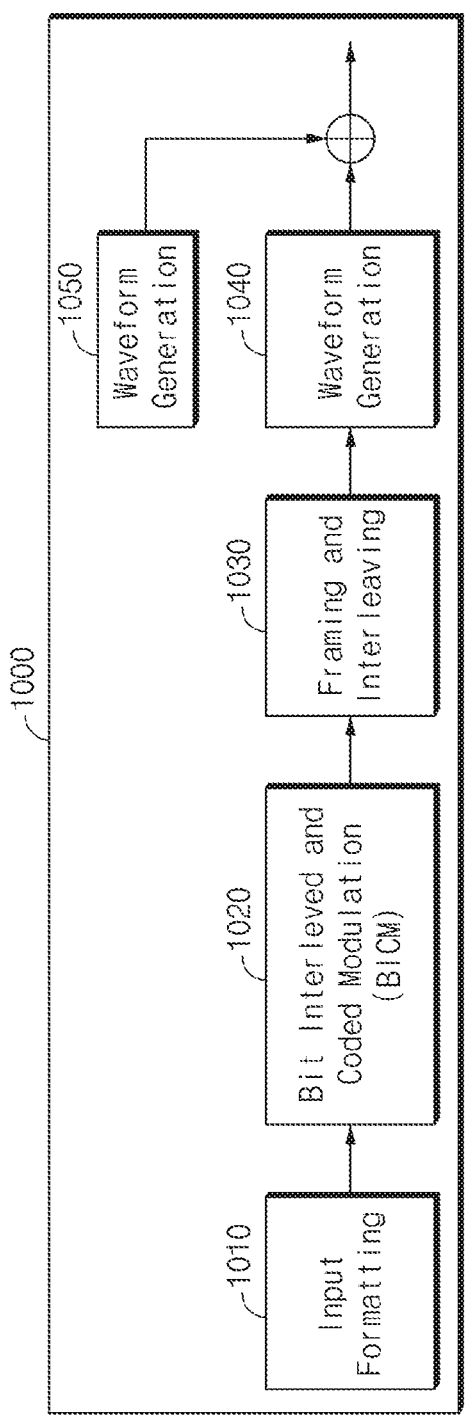
FIG. 10 is a block diagram illustrating a configuration of a transmitting apparatus according to another embodiment.

FIG. 10 illustrates a configuration of a transmitting apparatus according to another embodiment.

A transmitting apparatus 1000 of FIG. 10 may include a TxID signal generation block 1050 that generates a TxID signal. An input formatting block 1010, a BICM block 1020, a framing and interleaving block 1030, and a waveform generation block 1040 are the same as those of the transmitting apparatus 100 of FIG. 1 and therefore, a duplicated description will be omitted.

A TxID signal generated in the TxID signal generation block 1050 may be transmitted together with an output signal of the waveform generation block 1040. The transmitting apparatus 1000 may include the TxID signal in over-the-air (OTA) transmission.

Figure 11:
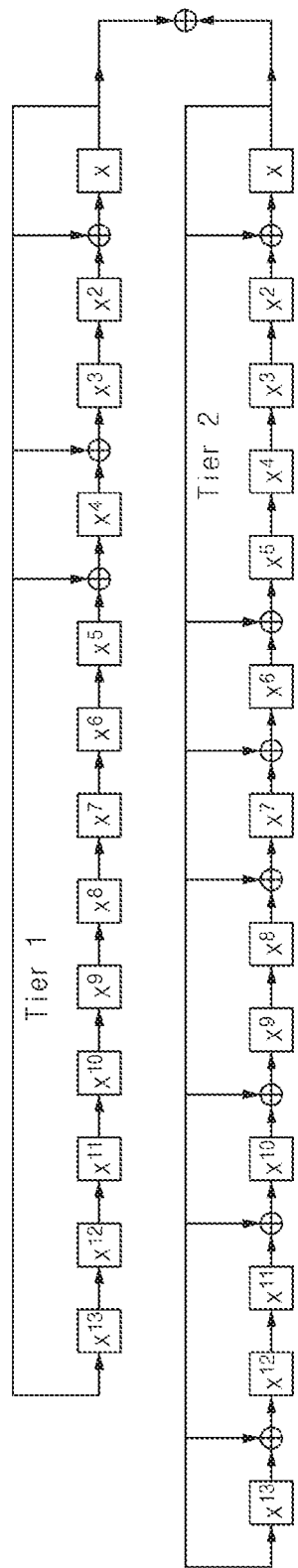
FIG. 11 illustrates a TxID code generator according to an embodiment.

FIG. 11 illustrates a TxID code generator according to an embodiment.

The TxID signal may be a direct sequence buried spread spectrum (DSBSS) RF watermark signal. The TxID may carry a unique Gold code sequence for each transmitter of a given RF channel.

Referring to FIG. 11, a code may be generated by a pair of shift registers defined by specific lengths, feedback paths, and summing functions. The combined output of the shift registers may be sent to a biphase shift keying (BPSK) modulator for subsequent injection into and transmission with the ATSC 3.0 host signal.

The two shift registers may be defined by the following equations 2 and 3.

$$x^{13}+x^{4}+x^{3}+x+1 \qquad [\text{Equation 1}]$$

$$x^{13}+x^{12}+x^{10}+x^{9}+x^{7}+x^{6}+x^{5}+x+1 \qquad [\text{Equation 2}]$$

Equation 1 may be a tier 1 generator polynomial and Equation 2 may be a tier 2 generator polynomial.

The TxID signal and the preamble signal may be synchronized. The first bit of the TxID pattern may be modulated and emitted simultaneously with the first sample of the first preamble signal including the symbol's guard interval. The second bit of the TxID pattern may be modulated and emitted simultaneously with the first sample of the second preamble signal of the symbol.

Figure 12:
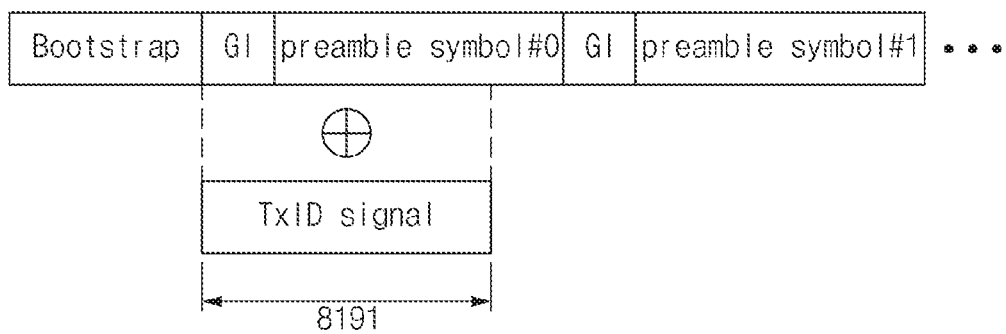
FIG. 12 illustrates an example of a relationship between an ATSC 3.0 frame and a TxID signal.

FIG. 12 illustrates an example of a relationship between an ATSC 3.0 frame and a TxID signal.

In one embodiment, the TxID signal may be transmitted only within the first preamble symbol period of a frame in which the ATSC 3.0 signal is transmitted. FIG. 12 illustrates a TxID signal injection scheme in the case of an 8K FFT preamble symbol. When the 8K FFT preamble symbol is used, a TxID signal may be transmitted once during the first preamble period. Although not illustrated in the accompanying drawings, when a 16K FFT preamble is used, the TxID signal is repeatedly transmitted twice during the first preamble period, and when a 32K FFT preamble is used, the TxID signal may be repeatedly transmitted four times. The FFT size of the preamble symbol may be indicated by a preamble_structure parameter. Various embodiments disclosed herein may be applied to TxID signal transmission schemes in the case of 16K FFT and 32K FFT preamble symbols in addition to 8K FFT.

A wide range of injection levels for injecting a TxID signal into the host ATSC 3.0 preamble may be used. An operator may minimize the performance degradation of the preamble while maintaining the TxID detection performance. The TxID injection level to use may be provided from a controlling scheduler to transmitter(s). The TxID injection level may be defined by a dB value, and the scaled TxID signal may be injected into the host ATSC3.0 preamble immediately following the bootstrap.

Table 2 shows TxID injection level codes, TxID injection levels, and scaling factors.

TABLE 2

| TxID injection level code | TxID injection level below preamble (dB) | Scaling Factor (Amplitude) |
|---|---|---|
| 0000 | OFF | 0 |
| 0001 | 45.0 dB | 0 |
| 0010 | 42.0 dB | 0.0056234 |
| 0011 | 39.0 dB | 0.0079433 |
| 0100 | 36.0 dB | 0.0112202 |
| 0101 | 33.0 dB | 0.0158489 |
| 0110 | 30.0 dB | 0.0223872 |
| 0111 | 27.0 dB | 0.0446684 |
| 1000 | 24.0 dB | 0.0630957 |
| 1001 | 21.0 dB | 0.0891251 |
| 1010 | 18.0 dB | 0.1258925 |

TABLE 2-continued

| TxID injection level code | TxID injection level below preamble (dB) | Scaling Factor (Amplitude) |
|---|---|---|
| 1011 | 15.0 dB | 0.1778279 |
| 1100 | 12.0 dB | 0.2511886 |
| 1101 | 9.0 dB | 0.3548134 |
| 1110 | Reserved | — |
| 1111 | Reserved | — |

Signaling fields for control of TxID emission may be used. In one embodiment, the signaling field may be txid_injection_lvl. The txid_injection_lvl field may indicate the injection level of the TxID signal. The txid_injection_lvl field may contain a TxID signal level code. When the Txid_injection_lvl field is zero, the TxID emission may be turned off.

In various embodiments disclosed herein, apparatuses and various methods for reducing performance degradation due to the TxID are proposed.

Figure 13:
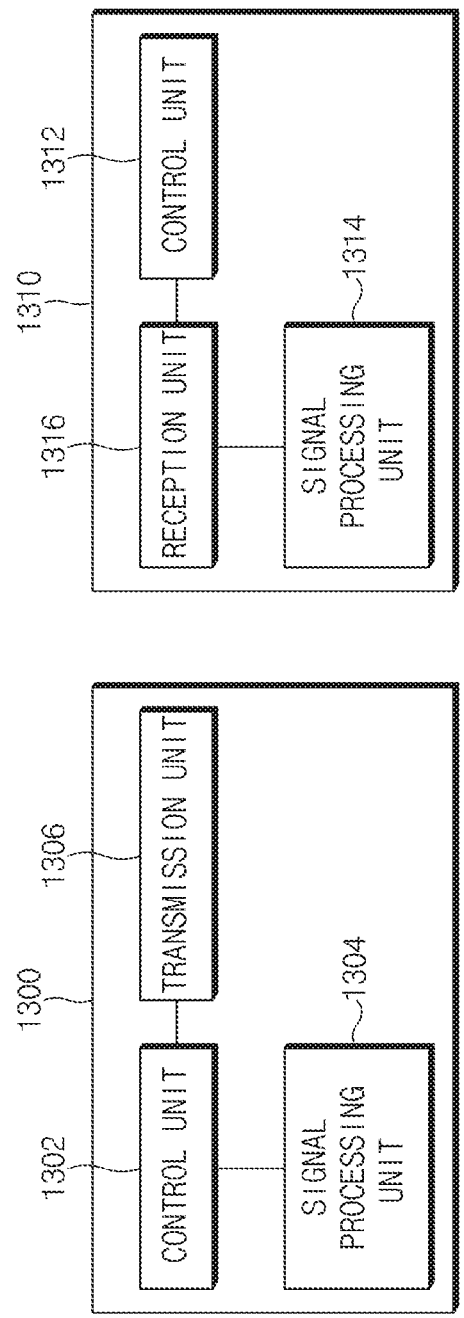
FIG. 13 illustrates a configuration of a transmitting apparatus and a receiving apparatus according to an embodiment.

FIG. 13 illustrates a configuration of a transmitting apparatus and a receiving apparatus according to an embodiment.

According to one embodiment, when a transmitting apparatus 1300 transmits a TxID signal, the transmitting apparatus 1300 may transmit an additional parity bit to a receiving apparatus 1310. According to one embodiment, the receiving apparatus 1310 may perform various operations described herein to reduce the TxID.

Referring to FIG. 13, the transmitting apparatus 1300 may include a control unit 1302, a signal processing unit 1304, and a transmission unit 1306.

The control unit 1302 may determine whether to generate a TxID signal. The control unit 1302 may determine whether to transmit the additional parity bit based on whether the TxID signal is generated.

The signal processing unit 1304 may process the additional parity bit and the TxID signal. The signal processing unit 1304 may process a first frame including additional parity bits for data signaling of a second frame and second frame data signaling.

The transmission unit 1306 may transmit additional parity bits and data signaling through the first frame and the second frame. The transmission unit 1306 may transmit the TxID signal.

The receiving apparatus 1310 may include a control unit 1312, a signal processing unit 1314, and a reception unit 1316. The receiving apparatus 1310 may receive a signal, transmitted from the transmitting apparatus 1300, through the reception unit 1316.

The control unit 1312 may determine whether a TxID is present and control the signal processing unit 1314. In one embodiment, the control unit 1312 may determine the number of additional decoding iterations. The control unit 1312 according to an embodiment may determine whether to reduce the TxID based on a bootstrap and/or a preamble.

The receiving apparatus 1310 may reduce or remove the TxID signal based on a signal processed by the signal processing unit 314. The signal processing unit 314 may perform decoding iteration. In one embodiment, the signal processing unit 1314 may perform additional decoding as many as the number of additional decoding iterations. In another embodiment, the signal processing unit 1314 may process the TxID signal, the bootstrap, and the preamble based on a received signal. The signal processing unit 314 may change a frequency band of the TxID signal based on a frequency band of the preamble signal for reduction of the TxID signal.

Figure 14:
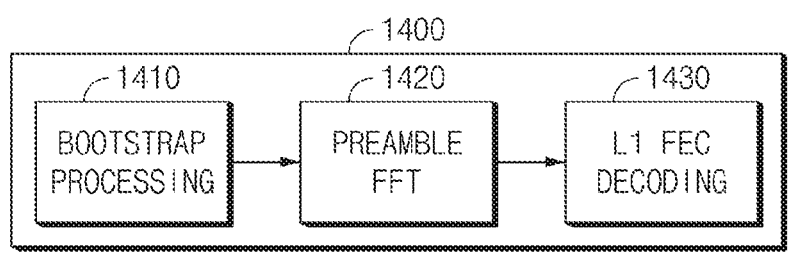
FIG. 14 is a block diagram illustrating a configuration of a signal processing unit of a receiving apparatus according to an embodiment.

FIG. 14 is a block diagram illustrating a configuration of a signal processing unit of a receiving apparatus according to an embodiment.

Referring to FIG. 14, a signal processing unit 1400 according to an embodiment may include at least one of a bootstrap processing block 1410, a preamble FFT block 1420, or an L1 FEC decoding block 1430.

In one embodiment, the bootstrap processing block 1410 may perform channel estimation based on the bootstrap. The receiving apparatus 1400 may reduce the TxID signal in the time domain of the preamble based on a result of the channel estimation.

In one embodiment, the preamble FFT block 1420 may perform a FFT to convert the received preamble from a time domain signal to a frequency domain signal. The receiving apparatus 1400 may reduce the TxID signal in the frequency domain of the preamble symbol.

In one embodiment, the L1 FEC decoding block 1430 may perform FEC decoding. The L1 FEC decoding block 1430 may perform decoding iteration. The L1 FEC decoding block 1430 may perform an additional decoding iteration.

Figure 15:
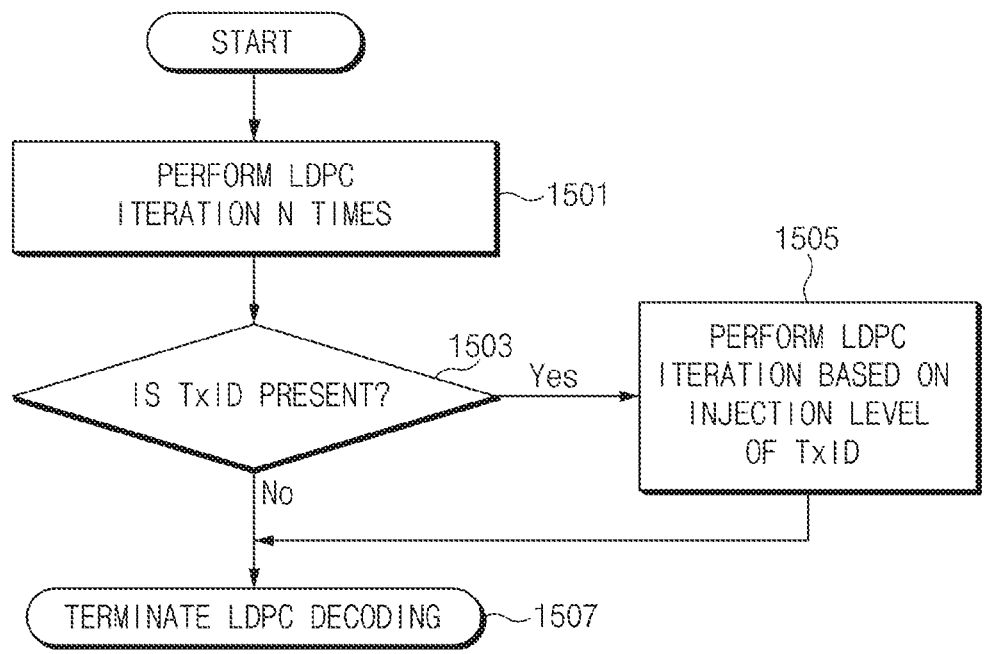
FIG. 15 is a flowchart of operation of a receiving apparatus according to an embodiment.

FIG. 15 is a flowchart of operation of a receiving apparatus according to an embodiment.

In the following description, a receiving apparatus (e.g., the receiving apparatus 1310 in FIG. 13) may perform additional decoding on a signal received from a transmitting apparatus (e.g., the transmitting apparatus 1300 in FIG. 3) based on the presence or absence of a TxID signal.

In operation 1501, the receiving apparatus may perform a decoding iteration. In one embodiment, the receiving apparatus may perform the LDPC decoding iteration N number of times. In this case, the number of times of LDPD decoding iterations may be referred to as the first iteration number.

In operation 1503, the receiving apparatus may determine whether a TxID is present. In one embodiment, the receiving apparatus may determine the presence or absence of a TxID based on the TxID signaling information.

In operation 1505, the receiving apparatus may perform an additional LDPC decoding iteration. The receiving apparatus may determine the number of additional LDPC decoding iterations. The receiving apparatus may acquire an injection level of the TxID and determine the number of additional LDPC decoding iterations based on the acquired injection level. The receiving apparatus may perform an additional decoding iteration based on the determined number of iterations. In one embodiment, the receiving apparatus may determine the number of additional LDPC decoding iterations to be proportional to the injection level. In one embodiment, the number of the additional LDPC decoding iterations may be referred to as the second number of iterations.

When the TxID is not present or the second LDPC decoding iteration is complete, the receiving apparatus may terminate the LDPC decoding in operation 1505.

Figure 16:
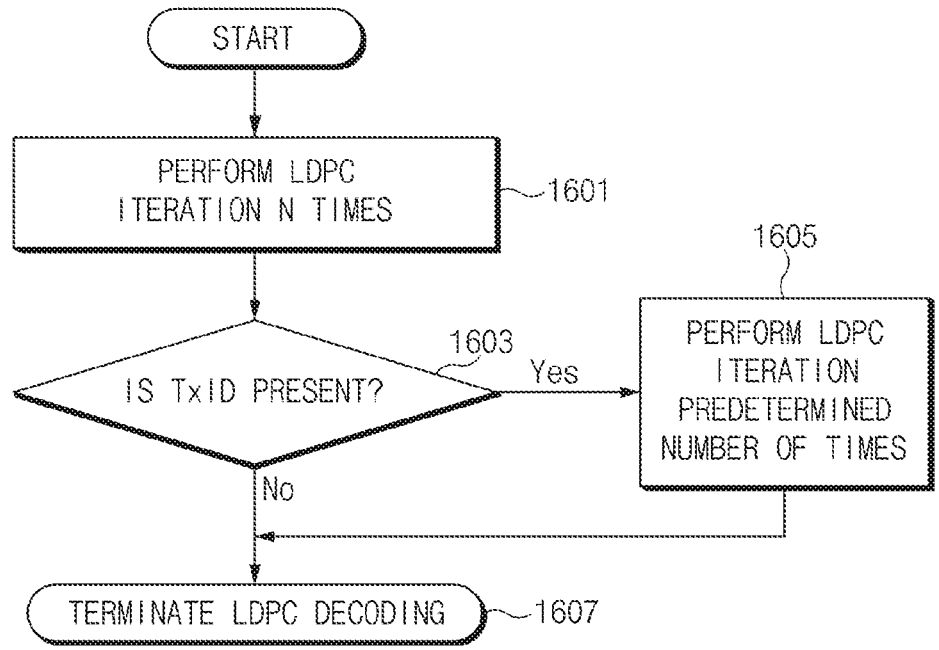
FIG. 16 is a flowchart of operation of a receiving apparatus according to another embodiment.

FIG. 16 is a flowchart of operation of a receiving apparatus according to another embodiment.

Operations 1601, 1603, and 1607 in FIG. 16 are the same as the operations 1501, 1503, and 1507 in FIG. 15, and therefore a duplicated description will be omitted.

When a TxID is present, in operation 1605, a receiving apparatus (e.g., the receiving apparatus 1310 of FIG. 13) may perform an additional decoding iteration. In one embodiment, the receiving apparatus may additionally perform an LDPC decoding iteration a predetermined number of times. In this case, the number of additional LDPC decoding iterations may be referred to as the number of second iterations.

Figure 17:
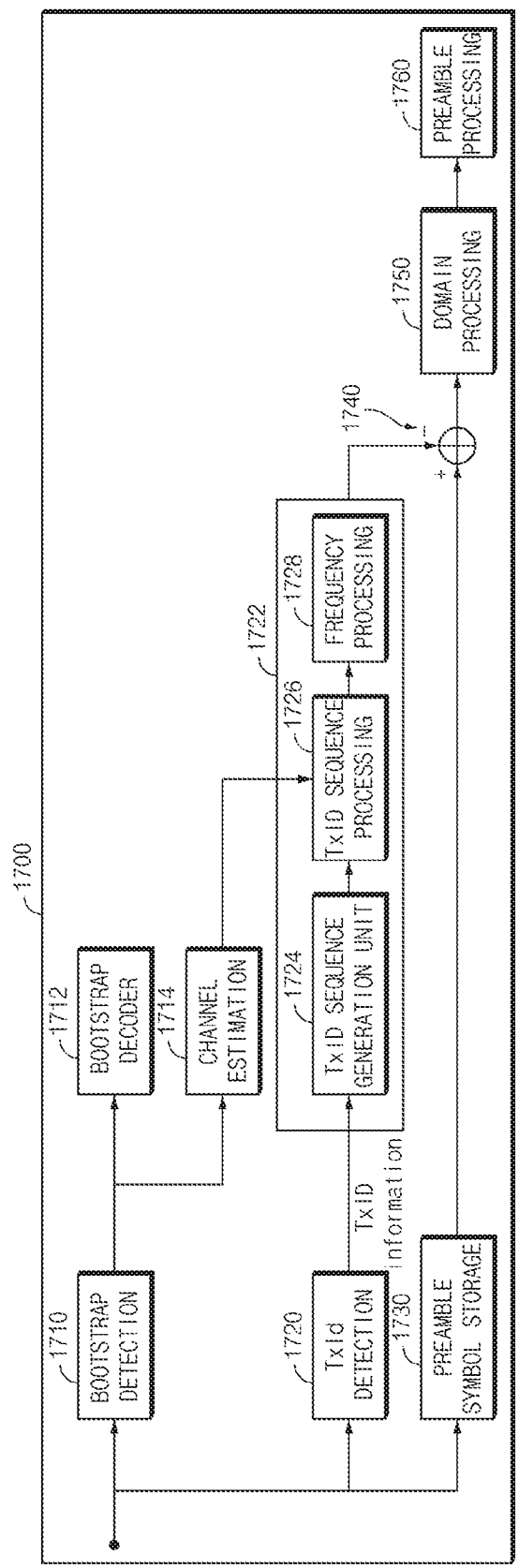
FIG. 17 is a block diagram illustrating a configuration of a receiving apparatus according to another embodiment.

FIG. 17 is a block diagram illustrating a configuration of a receiving apparatus according to another embodiment.

A receiving apparatus 1700 may reduce a TxID signal in the time domain to improve L1 decoding performance. The receiving apparatus 1700 may reduce or remove the TxID signal from a preamble signal to improve the decoding performance of the preamble signal. The receiving apparatus 1700 may change a frequency band of the TxID to reduce or remove the TxID signal.

Referring to FIG. 17, the receiving apparatus 1700 may include at least one of a bootstrap detection unit 1710 for detecting a bootstrap signal, a decoder 1712 for decoding the bootstrap signal, a channel estimation unit 1714 for estimating a channel based on the bootstrap signal, a TxID detection unit 1720 for detecting a TxID, a TxID processing unit 1722 for processing a detected TxID signal, a preamble symbol storage unit 1730 for storing a preamble symbol, a TxID reduction unit 1740, a domain conversion unit 1750 for converting a signal to a frequency domain signal, and a preamble processing unit 1760.

The channel estimation unit 1714 may estimate a channel based on the bootstrap signal. The channel estimation unit 1714 may estimate a multipath channel.

The TxID detection unit 1720 may detect whether a received signal includes a TxID signal. When a TxID signal is detected in the TxID detection unit 1720, the electronic device 1700 may perform additional processing of the TxID for reduction of the TxID.

The TxID processing unit 1722 may include a TxID sequence generation unit 1724, a TxID sequence processing unit 1726, and a frequency processing unit 1728.

The TxID generation unit 1724 may generate a TxID sequence based on TxID information acquired from the TxID detection unit 1720. The TxID sequence processing unit 1726 may process the TxID sequence based on a result of the channel estimation estimated based on the bootstrap and the TxID sequence.

The TxID sequence processing unit 1726 may generate the TxID sequence based on the result of the channel estimation. The TxID sequence processing unit 1726 may generate a TxID sequence reflecting the result of the channel estimation. The TxID sequence processing unit 1726 may change the TxID sequence using the estimated multi-path channel.

The frequency processing unit 1728 may change a frequency band of the TxID signal. The frequency processing unit 1728 may change the frequency band of the TxID signal based on a predefined frequency band or a frequency band of the preamble signal. For example, the frequency processing unit 1728 may change the TxID signal into a signal having the same band as the preamble signal. The frequency processing unit 1728 may be, for example, a low pass filter (LPF). The frequency processing unit 1728 may adjust the band of the estimated TxID signal or the TxID sequence. As an example, when an ATSC 3.0 preamble signal has a 6 MHz bandwidth, the frequency processing unit 1728 may change the TxID signal into 6 MHz.

The preamble symbol storage unit 1730 may include a memory for storing at least a preamble symbol among the received signals.

The TxID reduction unit 1740 may reduce the signal processed by the TxID processing unit 1722 in the received signal. The TxID reduction unit 1740 may reduce the TxID sequence in the received signal. The TxID reduction unit 1740 may remove the TxID sequence to which the channel estimation result is reflected from the preamble symbol. The TxID reduction unit 1740 may remove the TxID in the time domain.

The domain conversion unit 1750 may perform conversion of the domain of the received signal with the TxID reduced. The domain conversion unit 1750 may convert a domain of the signal from the time domain to the frequency domain, for example. The domain conversion unit 1750 may perform a FFT on the preamble signal with a reduced TxID, for example.

The preamble processing unit 1760 may process the preamble output from the domain conversion unit 1750. In one embodiment, the preamble processing unit 1760 may decode the preamble. The preamble processing unit 1760 may perform LDPC decoding.

In addition, the receiving apparatus 1700 may further include components not illustrated in FIG. 17. As an example, the receiving apparatus 1700 may further include a reception unit for receiving signals and/or a transmission unit for transmitting signals.

Figure 18:
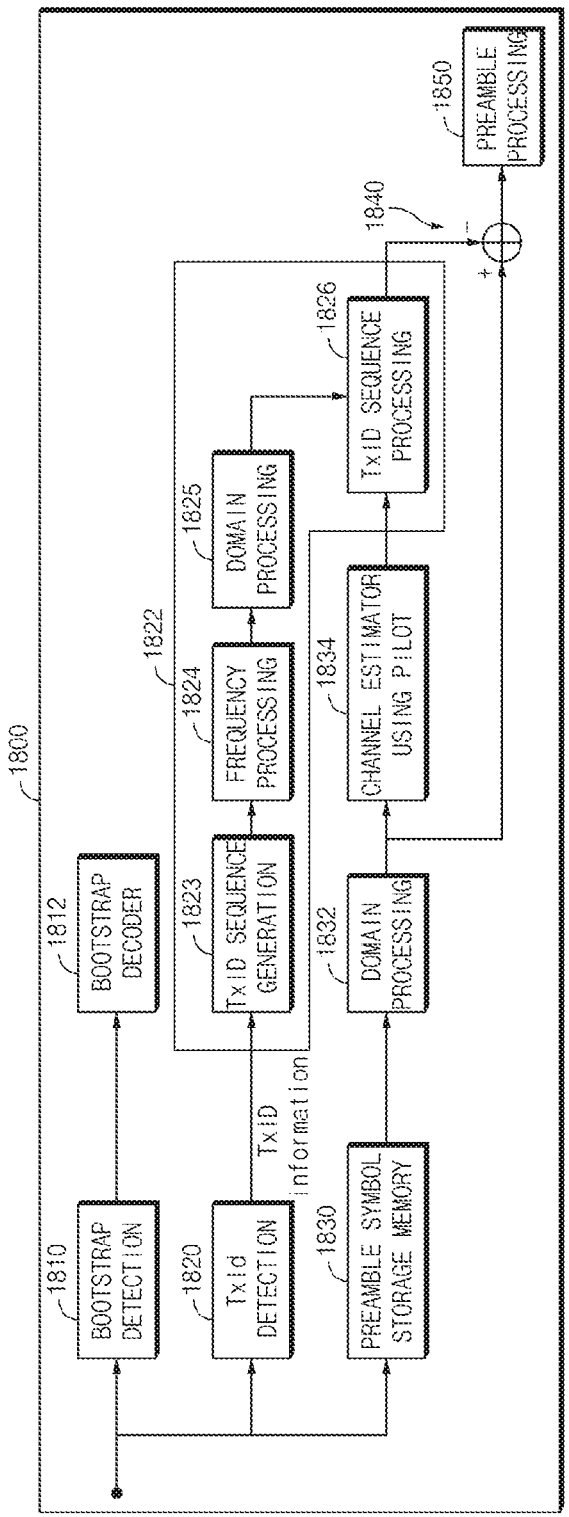
FIG. 18 is a block diagram illustrating a configuration of a receiving apparatus according to still another embodiment.

FIG. 18 is a block diagram illustrating a configuration of a receiving apparatus according to still another embodiment.

A receiving apparatus 1800 may reduce a TxID in the frequency domain and improve L1 decoding performance.

Referring to FIG. 18, the receiving apparatus 1800 may include at least one of a bootstrap detection unit 1810 for detecting a bootstrap signal, a bootstrap decoder 1812 for decoding the bootstrap signal, a TxID detection unit 1820 for detecting a TxID signal, a TxID processing unit 1822 for processing the detected TxID signal, a preamble symbol storage unit 1830 for storing a preamble symbol, a domain conversion unit 1832 for performing conversion of a domain of a preamble symbol, a channel estimation unit 1834, a TxID reduction unit 1840, and a preamble processing unit 1850.

The bootstrap detection unit 1810, the bootstrap decoder 1812, the TxID detection unit 1820 and the preamble symbol storage unit 1830 correspond to the bootstrap detection unit 1710, the bootstrap decoder 1712, the TxID detection unit 1720, and the preamble symbol storage unit 1730, respectively, and thus a duplicated description will be omitted.

When a TxID signal is detected by the TxID detection unit 1820, the TxID processing unit 1822 may perform appropriate processing on the TxID signal to reduce or remove the TxID signal from the received signal. The TxID processing unit 1822 may include at least one of a TxID sequence generation unit 1823, a frequency processing unit 1824, a domain conversion unit 1825, and a TxID sequence processing unit 1826.

The TxID sequence generation unit 1823 may generate a TxID sequence based on TxID information.

The frequency processing unit 1824 may change a frequency band of the TxID signal. The frequency processing unit 1824 may change a frequency band of the TxID signal into a predefined frequency band or change the frequency band of the TxID signal based on the frequency band of the preamble signal. The frequency processing unit 1824 may filter the TxID signal to be a signal having the same band as the preamble signal. The frequency processing unit 1824 may be, for example, a low pass filter (LPF).

The domain conversion unit 1825 may convert the TxID signal to a frequency domain signal. The domain conversion unit 1825 may perform, for example, a FFT.

The TxID sequence processing unit 1826 may generate a TxID sequence reflecting a channel state based on a channel estimated by the channel estimation unit 1834. The channel estimation unit 1834 may change the TxID sequence based on an estimated multipath channel.

The domain conversion unit 1832 may convert the preamble symbol to a frequency domain signal. The domain conversion unit 1825 may perform, for example, FFT. The channel estimation unit 1834 may estimate a channel based on the preamble. The channel estimation unit 1834 may estimate the channel based on a pilot of the preamble. The channel estimation unit 1834 may estimate the multi-path channel. In one embodiment, the pilot may be a pilot of a predefined pattern stored in the receiving apparatus 1800 in advance. An output of the channel estimation unit 1834 may be input to the TxID sequence processing unit 1826.

The TxID reduction unit 1840 may reduce the TxID sequence in a signal the domain of which is converted. The TxID reduction unit 1840 may remove the TxID sequence, for example, from the frequency domain. The TxID reduction unit 1840 may remove the TxID sequence from the preamble signal.

The preamble processing unit 1850 may process a received signal from which the TxID sequence is removed in the frequency domain. For example, the preamble processing unit 1850 may process the preamble in which TxID sequence is reduced. The preamble processing unit 1850 may perform LDPC decoding.

In addition, the receiving apparatus 1800 may further include components not shown in FIG. 18. As an example, the receiving apparatus 1800 may further include a reception unit for receiving signals and/or a transmission unit for transmitting signals.

Figure 19:
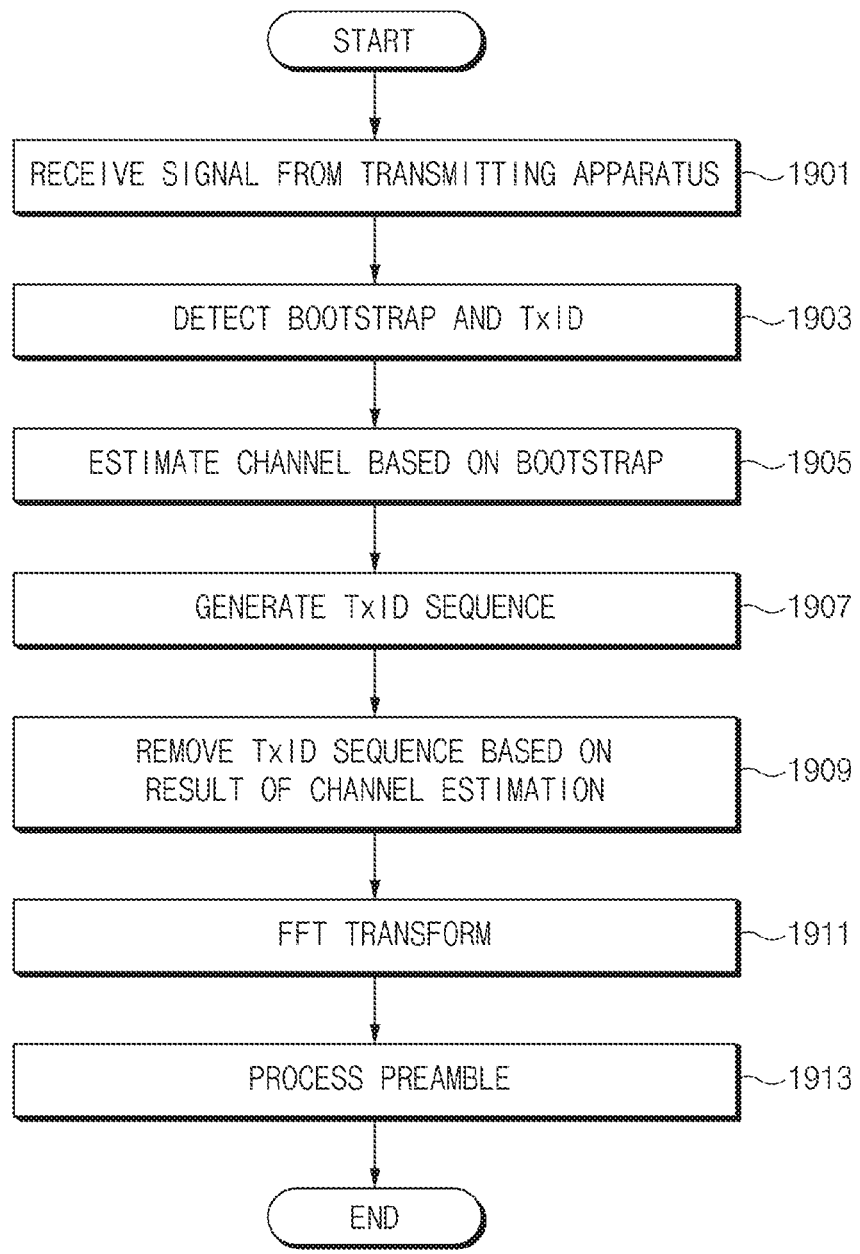
FIG. 19 is a flowchart of a method for reducing a TxID signal in the time domain according to an embodiment.

FIG. 19 is a flowchart of a method for reducing a TxID signal in the time domain according to an embodiment.

Referring to FIG. 19, a receiving apparatus (e.g., the receiving apparatus 1700 in FIG. 17) may reduce a TxID (transmitter identification) signal in the time domain in a signal received from a transmitting apparatus (e.g., the transmitting apparatus 1300 in FIG. 13) and process a preamble. The receiving apparatus may estimate a channel based on a bootstrap and reduce the TxID signal.

In operation 1901, the receiving apparatus may receive a signal from the transmitting apparatus. The receiving apparatus may receive a signal through a frame. The received signal may include at least one of a bootstrap, a preamble, data, and a TxID signal. In one embodiment, the frame may include a bootstrap, a preamble, and/or data. The frame may include at least one subframe carrying data.

In operation 1903, the receiving apparatus may detect the bootstrap and the TxID. The receiving apparatus may or may not perform the TxID reduction procedure based on a detection result of the TxID. When the receiving apparatus detects the TxID, the receiving apparatus may perform the necessary procedure to reduce the TxID in the received signal. In the following description, it is assumed that a TxID is transmitted. When the TxID is not transmitted, the receiving apparatus may not perform at least some of the following operations.

In operation 1905, the receiving apparatus may perform channel estimation. In one embodiment, the receiving apparatus may perform channel estimation based on a detected bootstrap signal. In one embodiment, the receiving apparatus may acquire a result of the multipath channel estimation.

In operation 1907, the receiving apparatus may generate a TxID sequence. The receiving apparatus may generate the TxID sequence based on the TxID information. In one embodiment, the receiving apparatus may acquire the TxID information based on detection of the TxID.

In one embodiment, the receiving apparatus may perform additional processing on the TxID sequence generated prior to reduction of the TxID sequence. The receiving apparatus may predict the TxID sequence generated in a transmitting apparatus and transmitted through a channel based on a channel estimation result (e.g., channel information). In one embodiment, the receiving apparatus may adjust a frequency band of the TxID signal. The receiving apparatus may change a TxID frequency band into a frequency band of a preamble signal. The receiving apparatus may change a frequency band of the TxID into a predefined frequency band or a frequency band determined based on the preamble signal. The receiving apparatus may perform filtering to change the TxID frequency band. For example, the receiving apparatus may perform low band pass filtering.

In operation 1909, the receiving apparatus may reduce the TxID sequence in a received signal. The receiving apparatus may remove the TxID sequence from the received signal, for example, based on the channel estimation result. The receiving apparatus may remove the TxID sequence from a signal corresponding to a preamble.

In operation 1911, the receiving apparatus may perform domain conversion. For example, the receiving apparatus may perform a Fast Fourier Transform (FFT). The receiving apparatus may perform the FFT on a signal from which the TxID sequence has been removed to convert the signal to a signal in the frequency domain. The receiving apparatus may perform a FFT on the preamble of which the TxID sequence has been removed.

In operation 1913, the receiving apparatus may process the preamble. The receiving apparatus may decode the preamble. In one embodiment, the receiving apparatus may perform LDPC decoding. The receiving apparatus may decode subsequent data based on the preamble.

According to one embodiment, it is possible to more accurately decode the preamble by reducing the TxID signal. The receiving apparatus may acquire more accurate information for data acquisition.

Figure 20:
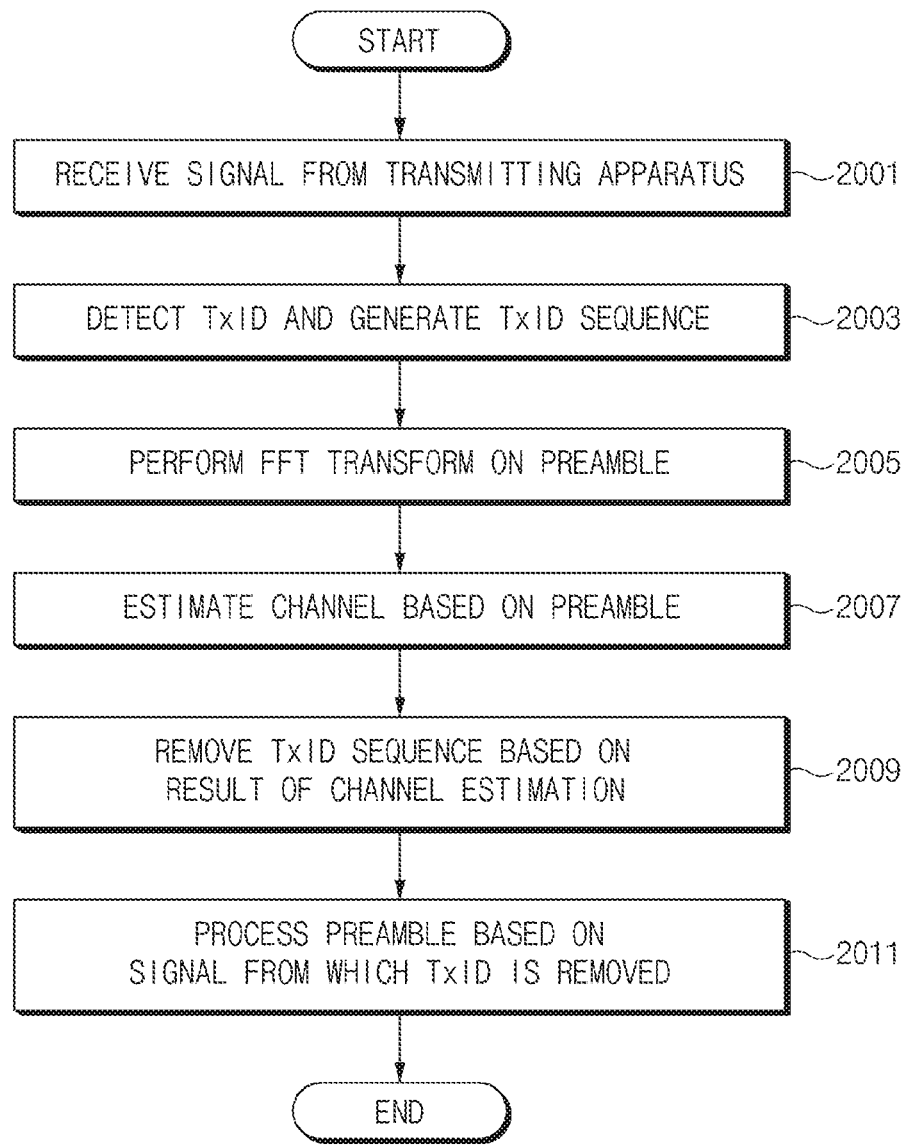
FIG. 20 is a flowchart of a method for reducing a TxID signal in the frequency domain according to another embodiment.

FIG. 20 is a flowchart of a method for reducing a TxID signal in a frequency domain according to another embodiment.

Referring to FIG. 20, a receiving apparatus (e.g., the receiving apparatus 1800 in FIG. 18) may reduce a TxID signal in a frequency domain from a signal received from a transmitting apparatus (e.g., the transmitting apparatus 1300 in FIG. 13) and process a preamble. The receiving apparatus may estimate a channel based on the preamble and reduce a TxID signal component.

In operation 2001, the receiving apparatus may receive a signal from a transmitting device. The receiving apparatus may receive a signal through a frame. The received signal may include at least one of a bootstrap, a preamble, data, and a TxID signal. In one embodiment, the frame may include a bootstrap, a preamble, and/or data. The frame may include at least one subframe carrying data.

In operation 2003, the receiving apparatus may detect a TxID and generate a TxID sequence. In the following description, it is assumed that the TxID is transmitted together with a received signal. When the TxID is not transmitted, the receiving apparatus may not perform at least some of the following operations. Although not illustrated in FIG. 21, in one embodiment, the receiving apparatus may detect and decode a bootstrap. In one embodiment, the receiving apparatus may acquire pilot information of the preamble based on the bootstrap.

In operation 2005, the receiving apparatus may perform a FFT. The receiving apparatus may convert the preamble symbol from a signal in the time domain to a signal in the frequency domain.

In operation 2007, the receiving apparatus may perform channel estimation. In one embodiment, the receiving apparatus may perform the channel estimation based on the preamble. In one embodiment, the receiving apparatus may perform the channel estimation based on a pilot of the preamble. The pilot may have a predefined pilot pattern between the receiving apparatus and the transmitting apparatus.

In operation 2009, the receiving apparatus may reduce the TxID sequence. The receiving apparatus may remove the TxID sequence from the received signal based on a channel estimation result. In one embodiment, the receiving apparatus may remove the TxID sequence from the preamble.

In one embodiment, the receiving apparatus may perform additional processing on the generated TxID sequence before reduction of the TxID sequence. The receiving apparatus may predict the TxID sequence, generated in a transmitting apparatus and transmitted through a channel, based on a channel estimation result (e.g., channel information). The receiving apparatus may generate a TxID sequence reflecting the channel estimation result.

In one embodiment, the receiving apparatus may adjust a frequency band of the TxID signal. The receiving apparatus may change a TxID frequency band into a frequency band of a preamble signal. For example, when the preamble signal is transmitted in a 6 MHz bandwidth and the TxID signal is transmitted in a 6.912 MHz bandwidth, the receiving apparatus may adjust a frequency band of the TxID signal to 6 MHz.

In one embodiment, the receiving apparatus may perform a FFT on the TxID signal.

The receiving apparatus may remove the TxID signal from a signal corresponding to the preamble in the frequency domain.

In operation 2011, the receiving apparatus may process the preamble. The receiving apparatus may process the preamble. The receiving apparatus may decode the preamble. In one embodiment, the receiving apparatus may perform LDPC decoding. The receiving apparatus may decode subsequent data based on the preamble. Here, the preamble may be a preamble after the TxID is reduced.

According to one embodiment, it is possible to more accurately decode the preamble by removing the TxID signal in the frequency domain. As the TxID signal, which acts as an interference in a received signal, is removed, a signal to noise ratio (SNR) in the receiving apparatus may be improved.

Figure 21:
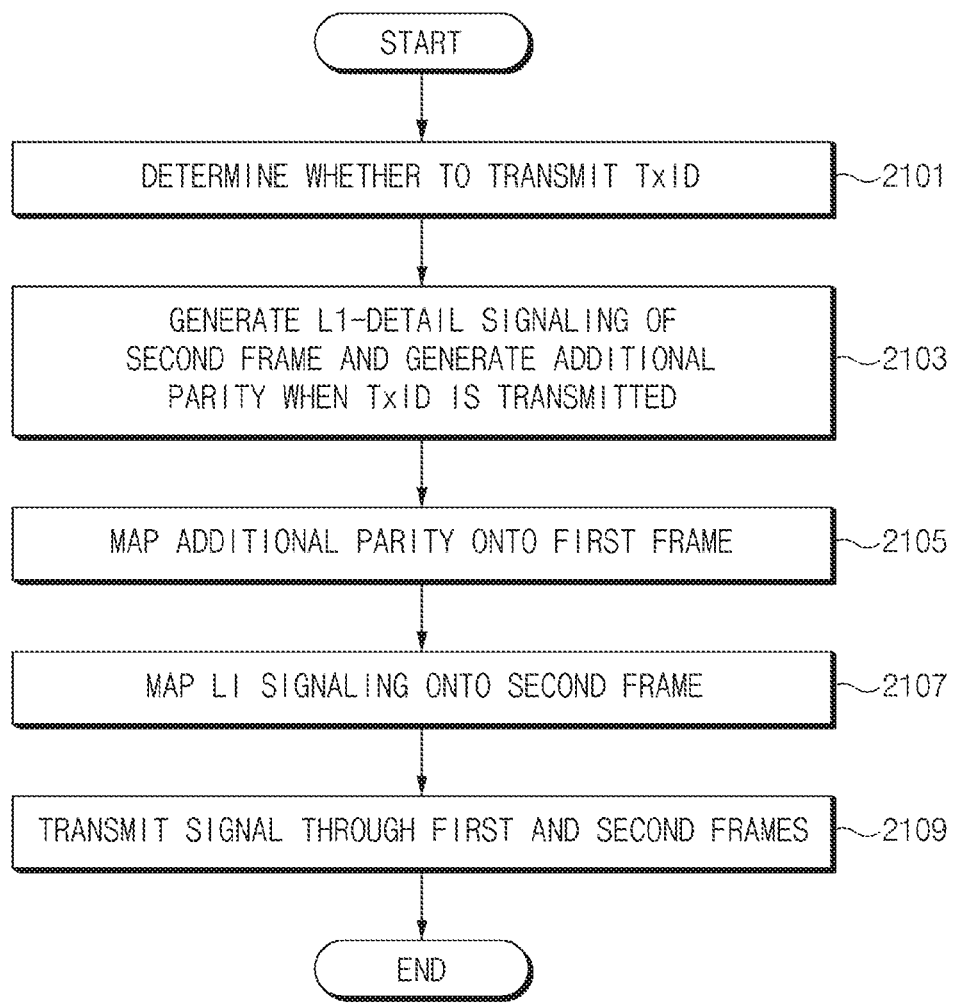
FIG. 21 is a flowchart of a transmission method in a transmitting apparatus according to another embodiment.

FIG. 21 is a flowchart of a transmission method for enhancing signal decoding performance in a transmitting apparatus according to another embodiment.

When performing TxID signaling, a transmitting apparatus (e.g., the transmitting apparatus 1300 in FIG. 13) may generate additional parity. When a TxID is injected, noise increases. Therefore, the additional parity for the LDPC of the L1-Detail may be transmitted in a first frame, which is a preceding frame of a second frame, which is the current frame.

In operation 2101, the transmitting apparatus may determine whether or not to transmit the TxID. In one embodiment, the transmitting apparatus may determine whether to transmit the TxID based on TxID-related information. In one embodiment, the transmitting apparatus may determine whether to transmit the TxID based on a TxID signaling field.

When the transmitting apparatus determines to transmit the TxID in operation 2103, the transmitting apparatus may generate the L1-Detail signaling of the second frame and generate the additional parity. In the disclosure, the TxID to be transmitted may be a TxID signal transmitted simultaneously with the second frame. The transmitting apparatus may generate additional parity for the L1-Detail signaling of the second frame.

In operation 2105, the transmitting apparatus may map the additional parity onto the first frame. In operation 2107, the transmitting apparatus may map the L1-Detail signaling onto the second frame. The transmitting apparatus may map an L1-Detail information bit and an L1-Detail parity bit onto the second frame.

For a receiver, LDPC decoding may be performed by combining the additional parity received in the first frame and the L1-Detail LDPC parity received in the second frame. Therefore, even when the TxID is transmitted, an effective coderate may be lowered. When the TxID is transmitted, the additional parity may be transmitted in the preceding frame of a frame in which the TxID is transmitted, thereby improving the LDPC decoding performance of the receiving apparatus.

Herein, the term "module" may refer to a unit that includes, for example, one or a combination of hardware, software or firmware. The term "module" may be interchangeably used with terms such as, unit, logic, logical block, component, or circuit. The module may be the minimum unit of an integrally constructed part or a part thereof. The module may be the minimum unit for performing one or more functions, or a part thereof. The module may be implemented mechanically or electronically. For example, the module may include at least one of an application-specific integrated circuit (ASIC) chip, field-programmable gate arrays (FPGAs), or a programmable-logic device, which are known or will be developed in the future, and which perform certain operations.

At least a part of an apparatus (e.g., modules or functions thereof) or a method (e.g., operations) according to various embodiments may be, for example, implemented by instructions stored in a computer-readable storage media in the form of a program module. The instruction, when executed by a processor, may cause the one or more processing units to perform a function corresponding to the instruction. The computer-readable storage medium may be, for example, a memory.

The computer-readable storage media may include magnetic media (e.g., a hard disk, a floppy disk, and magnetic tape), optical media (e.g., a compact disc read only memory (CD-ROM) and a digital versatile disc (DVD)), magneto-optical media (e.g., a floptical disk), and a hardware device (e.g., a read only memory (ROM), a random access memory (RAM) and a flash memory). The program command may include not only a machine code such as a code made by a compiler, but also a high-level language code that can be executed by the computer using an interpreter. The above-described hardware device may be configured to operate as one or more software modules to perform the operations according to various embodiments of the present disclosure, and vice versa.

A module or a programming module according to various embodiments of the disclosure may include at least one of the above-described components, some of which may be omitted, or may further include additional other components. Operations performed by a module, a programming module or other components according to various embodiments of the disclosure may be performed in a sequential, parallel, iterative or heuristic way. Furthermore, some of the operations may be performed in a different order, or omitted, or include other additional operation(s).

The embodiments disclosed herein are provided for description and understanding of the disclosed technology and do not limit the scope of the disclosure. Accordingly, the scope of the disclosure should be interpreted as including all changes or various embodiments based on the technical spirit of the disclosure.

The invention claimed is:

1. A receiving apparatus comprising:
a reception unit configured to receive a signal including at least a transmitter identification (TxID) signal;
a TxID detection unit configured to detect the TxID signal included in the received signal;
a TxID processing unit configured to change a frequency band of the TxID signal based on a result of detection of the TxID signal included in the received signal; and
a reduction unit configured to reduce the TxID signal from the received signal by using the TxID signal having the changed frequency band,
wherein the TxID processing unit includes a filter configured to change the frequency band of the TxID signal, and
wherein the filter is a low pass filter.

2. The receiving apparatus of claim 1, wherein the TxID processing unit is configured to change the frequency band of the detected TxID signal into a predetermined band.

3. The receiving apparatus of claim 1, wherein the received signal further includes a preamble signal, and
the TxID processing unit is configured to change the frequency band of the detected TxID signal based on a frequency band of the preamble signal.

4. The receiving apparatus of claim 1, wherein the received signal further includes at least one of a channel estimation signal or a preamble signal, and
the receiving apparatus further comprises:
a channel estimation unit configured to estimate a channel using the channel estimation signal or the preamble signal,
wherein the TxID processing unit is configured to process the TxID signal based on a result of the channel estimation.

5. The receiving apparatus of claim 4, wherein the TxID processing unit is configured to generate a TxID sequence of the TxID signal and process the TxID sequence based on the result of the channel estimation.

6. The receiving apparatus of claim 5, wherein the channel estimation signal includes a bootstrap.

7. The receiving apparatus of claim 1, wherein the TxID processing unit includes a first conversion unit configured to convert the TxID signal to a frequency domain signal.

8. The receiving apparatus of claim 7, further comprising:
a second conversion unit configured to convert the received signal to a frequency domain signal,
wherein the reduction unit is configured to reduce the converted TxID signal in the converted signal in a frequency domain.

9. The receiving apparatus of claim 1, further comprising:
a signal processing unit configured to decode a signal in which the TxID signal is reduced.

10. The receiving apparatus of claim 9, wherein the signal processing unit is configured to perform low density parity check (LDPC) decoding.

11. The receiving apparatus of claim 1, wherein the received signal further includes a preamble signal, and
the preamble signal is an advanced television system committee (ATSC) 3.0 signal.

12. A receiving method comprising:
receiving a signal including at least a transmitter identification (TxID) signal;
detecting the TxID signal included in the received signal;
changing a frequency band of the TxID signal based on a result of detection of the TxID signal included in the received signal; and
reducing the TxID signal from the received signal by using the TxID signal having the changed frequency band,
wherein the changing of the frequency band includes changing the frequency band of the detected TxID signal by using a filter, and
wherein the filter is a low pass filter.

13. The receiving method of claim 12, wherein the changing of the frequency band includes changing the frequency band of the detected TxID signal into a predetermined band.

14. The receiving method of claim 12, wherein the received signal further includes a preamble signal, and
the changing of the frequency band includes changing the frequency band of the detected TxID signal based on a frequency band of the preamble signal.

15. The receiving method of claim 12, wherein the received signal further includes at least one of a channel estimation signal or a preamble signal, and
the method further comprising:
estimating a channel using the channel estimation signal or the preamble signal, and
processing the TxID signal based on a result of the channel estimation.

16. The receiving method of claim 15, wherein the processing of the TxID signal comprises generating a TxID sequence of the TxID signal and processing the TxID sequence based on the result of the channel estimation.

* * * * *